United States Patent
Sarraf et al.

(10) Patent No.: US 9,583,153 B1
(45) Date of Patent: Feb. 28, 2017

(54) MEMORY CARD PLACEMENT WITHIN A SOLID STATE DRIVE

(71) Applicant: Western Digital Technologies, Inc., Irvine, CA (US)

(72) Inventors: Mohammad Sarraf, Trabuco Canyon, CA (US); Cuong Hoang, Cerritos, CA (US); John P. Myers, Lake Forest, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 431 days.

(21) Appl. No.: 14/090,297

(22) Filed: Nov. 26, 2013

Related U.S. Application Data

(60) Provisional application No. 61/840,758, filed on Jun. 28, 2013.

(51) Int. Cl.
*G11C 5/04* (2006.01)
*G11C 5/12* (2006.01)

(52) U.S. Cl.
CPC . *G11C 5/04* (2013.01); *G11C 5/12* (2013.01)

(58) Field of Classification Search
CPC .............................................. G11C 5/02–5/12
USPC ........................ 361/679.31, 679.32, 760, 784
See application file for complete search history.

(56) References Cited

U.S. PATENT DOCUMENTS

| | | |
|---|---|---|
| 6,856,556 B1 | 2/2005 | Hajeck |
| 7,126,857 B2 | 10/2006 | Hajeck |
| 7,430,136 B2 | 9/2008 | Merry, Jr. et al. |
| 7,447,807 B1 | 11/2008 | Merry et al. |
| 7,502,256 B2 | 3/2009 | Merry, Jr. et al. |
| 7,509,441 B1 | 3/2009 | Merry et al. |
| 7,596,643 B2 | 9/2009 | Merry, Jr. et al. |
| 7,653,778 B2 | 1/2010 | Merry, Jr. et al. |
| 7,685,337 B2 | 3/2010 | Merry, Jr. et al. |
| 7,685,338 B2 | 3/2010 | Merry, Jr. et al. |
| 7,685,374 B2 | 3/2010 | Diggs et al. |
| 7,733,712 B1 | 6/2010 | Walston et al. |
| 7,765,373 B1 | 7/2010 | Merry et al. |
| 7,898,855 B2 | 3/2011 | Merry, Jr. et al. |
| 7,912,991 B1 | 3/2011 | Merry et al. |
| 7,936,603 B2 | 5/2011 | Merry, Jr. et al. |
| 7,962,792 B2 | 6/2011 | Diggs et al. |
| 7,975,105 B1 | 7/2011 | Sun et al. |
| 8,078,918 B2 | 12/2011 | Diggs et al. |
| 8,090,899 B1 | 1/2012 | Syu |
| 8,095,851 B2 | 1/2012 | Diggs et al. |

(Continued)

*Primary Examiner* — Ramon M Barrera
(74) *Attorney, Agent, or Firm* — Shumaker & Sieffert, P.A.

(57) ABSTRACT

A data storage device (DSD) with improved manufacturing method. The DSD includes a main printed circuit board (PCB) that includes a first PCB connector and a second PCB connector. The DSD also includes a first flash card mounted over the main PCB and including a flash memory and a flash card connector configured to connect to the first PCB connector, and a second flash card mounted over the main PCB and including a flash memory and a flash card connector configured to connect to the second PCB connector. The first flash card and the second flash card are mounted over the main PCB in a plane substantially parallel with the main PCB. The main PCB can be mounted to a base before connecting the first and second flash cards, or the first and second flash cards can be mounted to the main PCB before mounting to the base.

20 Claims, 17 Drawing Sheets

(56) References Cited

U.S. PATENT DOCUMENTS

| | | |
|---|---|---|
| 8,108,692 B1 | 1/2012 | Merry et al. |
| 8,122,185 B2 | 2/2012 | Merry, Jr. et al. |
| 8,127,048 B1 | 2/2012 | Merry et al. |
| 8,135,903 B1 | 3/2012 | Kan |
| 8,151,020 B2 | 4/2012 | Merry, Jr. et al. |
| 8,161,227 B1 | 4/2012 | Diggs et al. |
| 8,166,245 B2 | 4/2012 | Diggs et al. |
| 8,243,525 B1 | 8/2012 | Kan |
| 8,254,172 B1 | 8/2012 | Kan |
| 8,261,012 B2 | 9/2012 | Kan |
| 8,296,625 B2 | 10/2012 | Diggs et al. |
| 8,312,207 B2 | 11/2012 | Merry, Jr. et al. |
| 8,316,176 B1 | 11/2012 | Phan et al. |
| 8,341,339 B1 | 12/2012 | Boyle et al. |
| 8,375,151 B1 | 2/2013 | Kan |
| 8,392,635 B2 | 3/2013 | Booth et al. |
| 8,397,107 B1 | 3/2013 | Syu et al. |
| 8,407,449 B1 | 3/2013 | Colon et al. |
| 8,423,722 B1 | 4/2013 | Deforest et al. |
| 8,433,858 B1 | 4/2013 | Diggs et al. |
| 8,443,167 B1 | 5/2013 | Fallone et al. |
| 8,447,920 B1 | 5/2013 | Syu |
| 8,458,435 B1 | 6/2013 | Rainey, III et al. |
| 8,478,930 B1 | 7/2013 | Syu |
| 8,489,854 B1 | 7/2013 | Colon et al. |
| 8,503,237 B1 | 8/2013 | Horn |
| 8,521,972 B1 | 8/2013 | Boyle et al. |
| 8,549,236 B2 | 10/2013 | Diggs et al. |
| 8,583,835 B1 | 11/2013 | Kan |
| 8,601,311 B2 | 12/2013 | Horn |
| 8,601,313 B1 | 12/2013 | Horn |
| 8,612,669 B1 | 12/2013 | Syu et al. |
| 8,612,804 B1 | 12/2013 | Kang et al. |
| 8,615,681 B2 | 12/2013 | Horn |
| 8,638,602 B1 | 1/2014 | Horn |
| 8,639,872 B1 | 1/2014 | Boyle et al. |
| 8,683,113 B2 | 3/2014 | Abasto et al. |
| 8,700,834 B2 | 4/2014 | Horn et al. |
| 8,700,950 B1 | 4/2014 | Syu |
| 8,700,951 B1 | 4/2014 | Call et al. |
| 8,706,985 B1 | 4/2014 | Boyle et al. |
| 8,707,104 B1 | 4/2014 | Jean |
| 8,713,066 B1 | 4/2014 | Lo et al. |
| 8,713,357 B1 | 4/2014 | Jean et al. |
| 8,719,531 B2 | 5/2014 | Strange et al. |
| 8,724,422 B1 | 5/2014 | Agness et al. |
| 8,725,931 B1 | 5/2014 | Kang |
| 8,745,277 B2 | 6/2014 | Kan |
| 8,751,728 B1 | 6/2014 | Syu et al. |
| 8,769,190 B1 | 7/2014 | Syu et al. |
| 8,769,232 B2 | 7/2014 | Suryabudi et al. |
| 8,775,720 B1 | 7/2014 | Meyer et al. |
| 8,782,327 B1 | 7/2014 | Kang et al. |
| 8,788,778 B1 | 7/2014 | Boyle |
| 8,788,779 B1 | 7/2014 | Horn |
| 8,788,880 B1 | 7/2014 | Gosla et al. |
| 8,793,429 B1 | 7/2014 | Call et al. |
| 2009/0063895 A1 | 3/2009 | Smith |
| 2010/0174849 A1 | 7/2010 | Walston et al. |
| 2010/0250793 A1 | 9/2010 | Syu |
| 2011/0099323 A1 | 4/2011 | Syu |
| 2011/0283049 A1 | 11/2011 | Kang et al. |
| 2011/0320690 A1* | 12/2011 | Petersen ............... G06F 3/0611 711/103 |
| 2012/0260020 A1 | 10/2012 | Suryabudi et al. |
| 2012/0278531 A1 | 11/2012 | Horn |
| 2012/0284460 A1 | 11/2012 | Guda |
| 2012/0304455 A1 | 12/2012 | Schuette |
| 2012/0324191 A1 | 12/2012 | Strange et al. |
| 2013/0132638 A1 | 5/2013 | Horn et al. |
| 2013/0145106 A1 | 6/2013 | Kan |
| 2013/0290793 A1 | 10/2013 | Booth et al. |
| 2014/0059405 A1 | 2/2014 | Syu et al. |
| 2014/0101369 A1 | 4/2014 | Tomlin et al. |
| 2014/0115427 A1 | 4/2014 | Lu |
| 2014/0133220 A1 | 5/2014 | Danilak et al. |
| 2014/0136753 A1 | 5/2014 | Tomlin et al. |
| 2014/0149826 A1 | 5/2014 | Lu et al. |
| 2014/0157078 A1 | 6/2014 | Danilak et al. |
| 2014/0181432 A1 | 6/2014 | Horn |
| 2014/0223255 A1 | 8/2014 | Lu et al. |

* cited by examiner

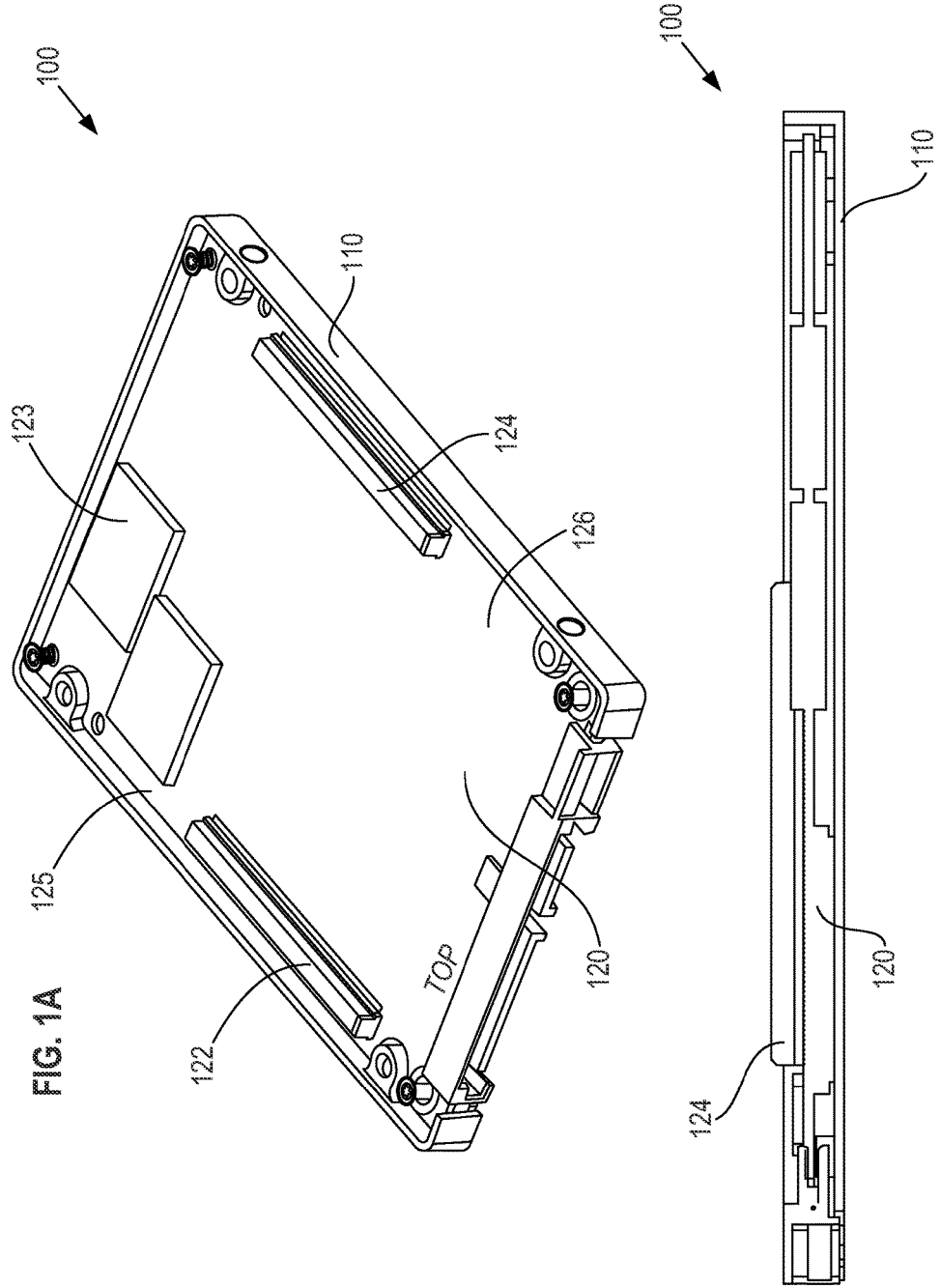

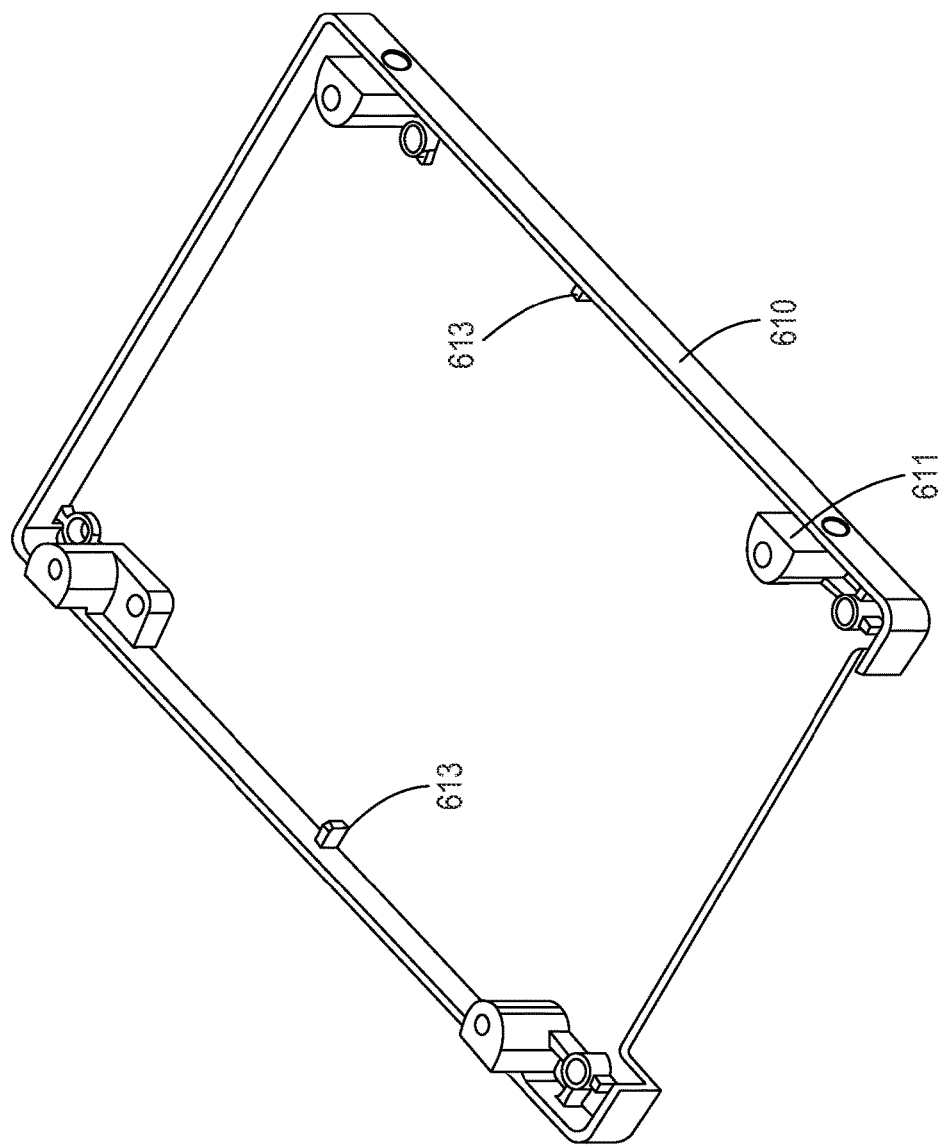

MEMORY CARD PLACEMENT WITHIN A SOLID STATE DRIVE

CROSS-REFERENCE TO RELATED APPLICATION(S)

This application claims the benefit of U.S. Provisional Application No. 61/840,758, filed on Jun. 28, 2013, which is hereby incorporated by reference in its entirety.

BACKGROUND

A data storage device (DSD), such as a hard disk drive (HDD), a solid state drive (SSD), or solid state hybrid drive (SSHD), may include a System-on-a-Chip (SoC) and flash memory on a single, main printed circuit board (PCB). Additional flash memory may be mounted on a separate flash card, which is connected to the main PCB. The flash card may be placed above the main PCB, attached through a connector.

In some configurations, the flash card may be connected to the main PCB through two connectors. The connectors may be misaligned due to mechanical component tolerances stacking up, and manufacturing variances. The connector misalignment may cause stress in the flash card.

BRIEF DESCRIPTIONS OF THE DRAWINGS

The features and advantages of the implementations of the present disclosure will become more apparent from the detailed description set forth below when taken in conjunction with the drawings. The drawings and the associated descriptions are provided to illustrate implementations of the disclosure and not to limit the scope of what is claimed.

FIG. 1A is a view of part of a DSD according to an implementation of the present disclosure;

FIG. 1B a side view of FIG. 1A;

FIG. 6C is a view of the base in FIG. 6A;

DETAILED DESCRIPTION

Figure 1C:
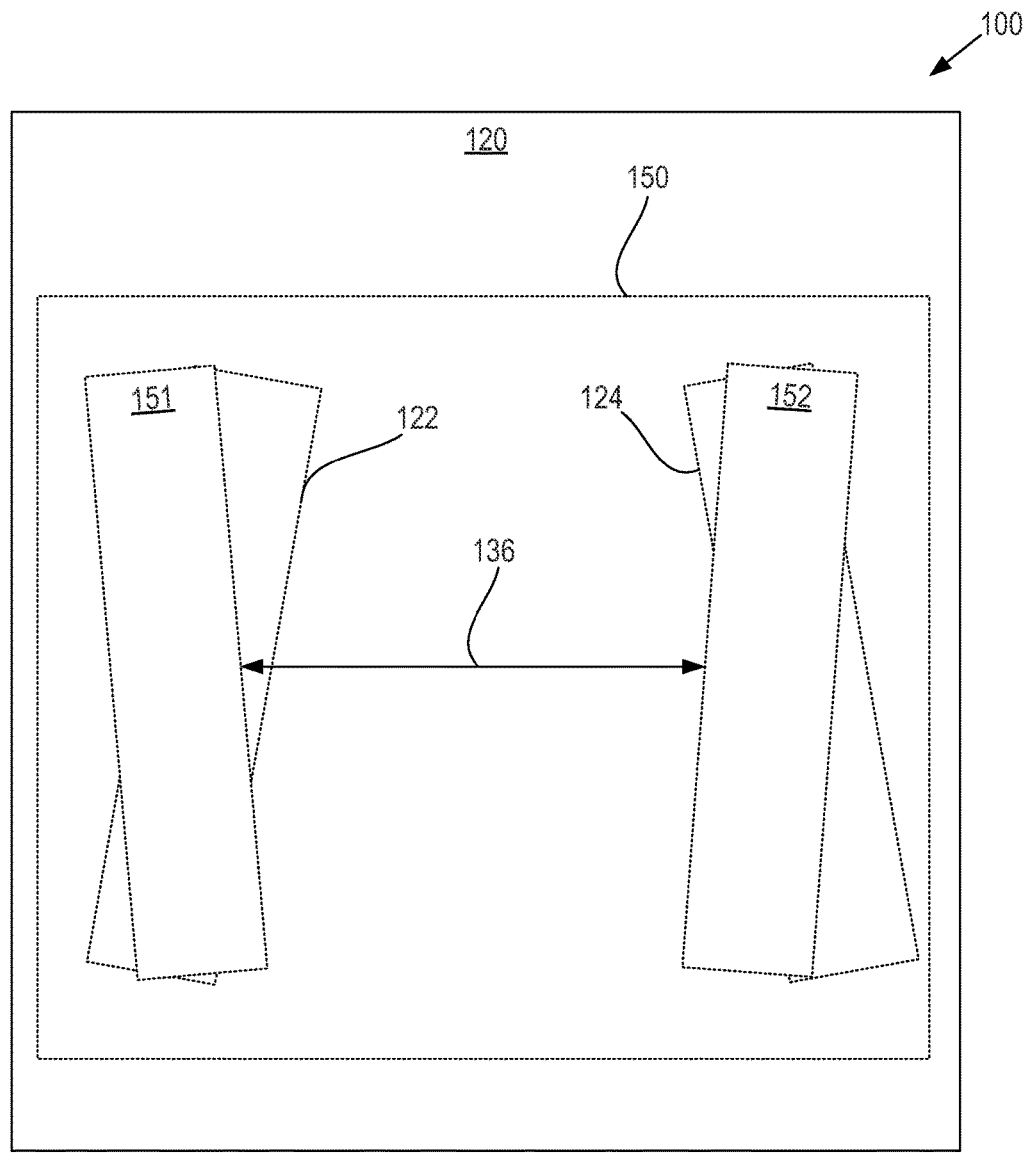
FIG. 1C is a conceptual diagram of connector placement on a main PCB of a DSD.

In the following detailed description, numerous specific details are set forth to provide a full understanding of the present disclosure. It will be apparent, however, to one of ordinary skill in the art that the various implementations disclosed may be practiced without some of these specific details. In other instances, well-known structures and techniques have not been shown in detail to avoid unnecessarily obscuring the various implementations.

While the description herein refers generally to a solid state memory such as a NAND flash memory, it is understood that other implementations can include one or more of various types of solid state memory such as Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NAND memory (e.g., single-level cell (SLC) memory, multi-level cell (MLC) memory, or any combination thereof), NOR memory, EEPROM, Ferroelectric Memory (FeRAM), Magnetoresistive RAM (MRAM), spin-transfer torque RAM (STT-RAM), other discrete non-volatile memory (NVM) chips, or any combination thereof.

FIG. 1A presents a DSD 100 according to an implementation of the present disclosure. FIG. 1B presents a side view of the DSD 100. The DSD 100 includes a base 110 and a main PCB 120. The main PCB includes a plurality of components 123 and also includes a first PCB connector 122 along a first side 125, and a second PCB connector 124 along a second side 126. Due to space requirements, in particular in small form factor applications such as 2.5 in drives, additional components, such as flash memory, are mounted on a separate PCB, such as a flash card. Having the flash memory on a separate flash card allows for mounting components 123, which may include an SoC, as well as traces for various connections (not shown). The flash card connects to the main PCB through the first PCB connector 122 and the second PCB connector 124.

Due to manufacturing variances or tolerances, the flash card's connectors may not align perfectly with the first PCB connector 122 and the second PCB connector 124. FIG. 1C shows an exaggerated view of possible misalignment. A flash card 150 is shown as an outline. The flash card 150 includes a first connector 151 and a second connector 152, also shown in outline. FIG. 1C shows an extreme example of all four connectors being misaligned in different directions. In addition, a distance 136 between the first PCB connector 122 and the second PCB connector 124 may vary.

When the flash card 150 is installed onto the main PCB 120, a large amount of force, for example 40+ lbs., may be required to overcome the misalignment of the connectors. This may cause unwanted flash card warping, unreliable connections, and other defects which may not be detected during factory testing but cause failures in the field when thermal expansion and/or shock events aggregate the misalignment issues. In addition, the connectors may not be pin-and-socket type connections and therefore more fragile. As the connector pitch (the width between pins) is reduced due to the increased number of pins needed, the stress from force fitting the flash card 150 is exacerbated.

Figure 2A:
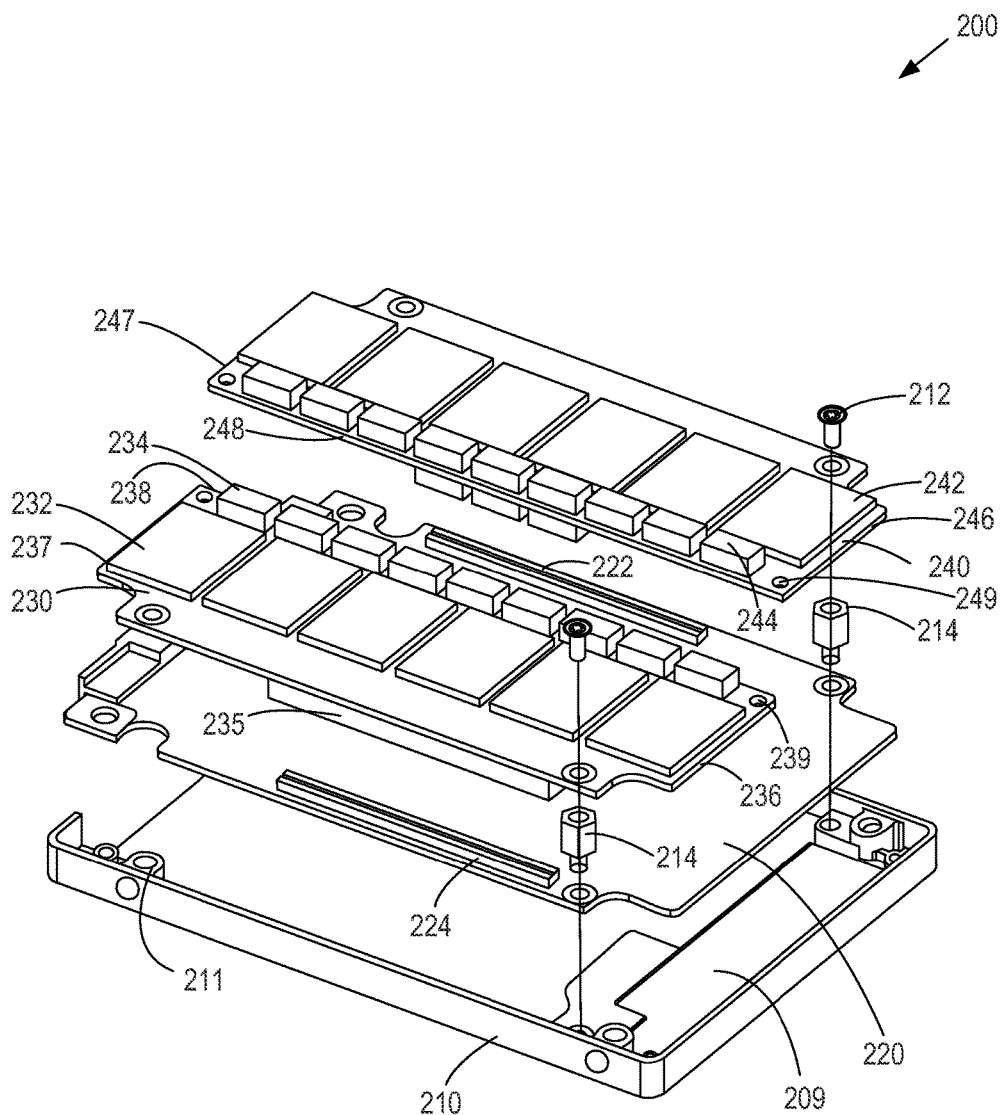
FIG. 2A is an exploded view of a DSD according to an implementation of the present disclosure.

FIG. 2A shows a DSD 200 according to an implementation of the present disclosure. The DSD 200 includes a base 210, and main PCB 220, a first flash card 240, and a second flash card 230. The base 210 includes a standard standoff 211, a component mount cavity 209, which may be parts of a preconfigured base casting. The main PCB 220 includes a first PCB connector 222 and a second PCB connector 224.

The first flash card 240 includes a first edge 246, a second edge 247 opposite the first edge 246, and a third edge 248 connecting the first edge 246 and the second edge 247, a plurality of flash memory 242, a plurality of capacitors 244, and a recess 249. The second flash card 230 includes a first edge 236, a second edge 237 opposite the first edge 236, and a third edge 238 connecting the first edge 236 and the second edge 237, a plurality of flash memory 232, a plurality of capacitors 234, a recess 239, and a connector 235. The connector 235 connects to the second PCB connector 224. The first flash card 240 also has a connector (not shown) for connecting to the first PCB connector 222. A pair of screw standoffs 214 receives a pair of screws 212 to mount the first flash card 240, the second flash card 230, and the main PCB 220 to the base 210. Rather than a single flash card, such as the flash card 150, the flash memory is mounted on two separate flash cards, which may be symmetrical. In other words, the two flash cards may have the same design or layout, and one being rotated to fit on the other side.

Figure 2B:
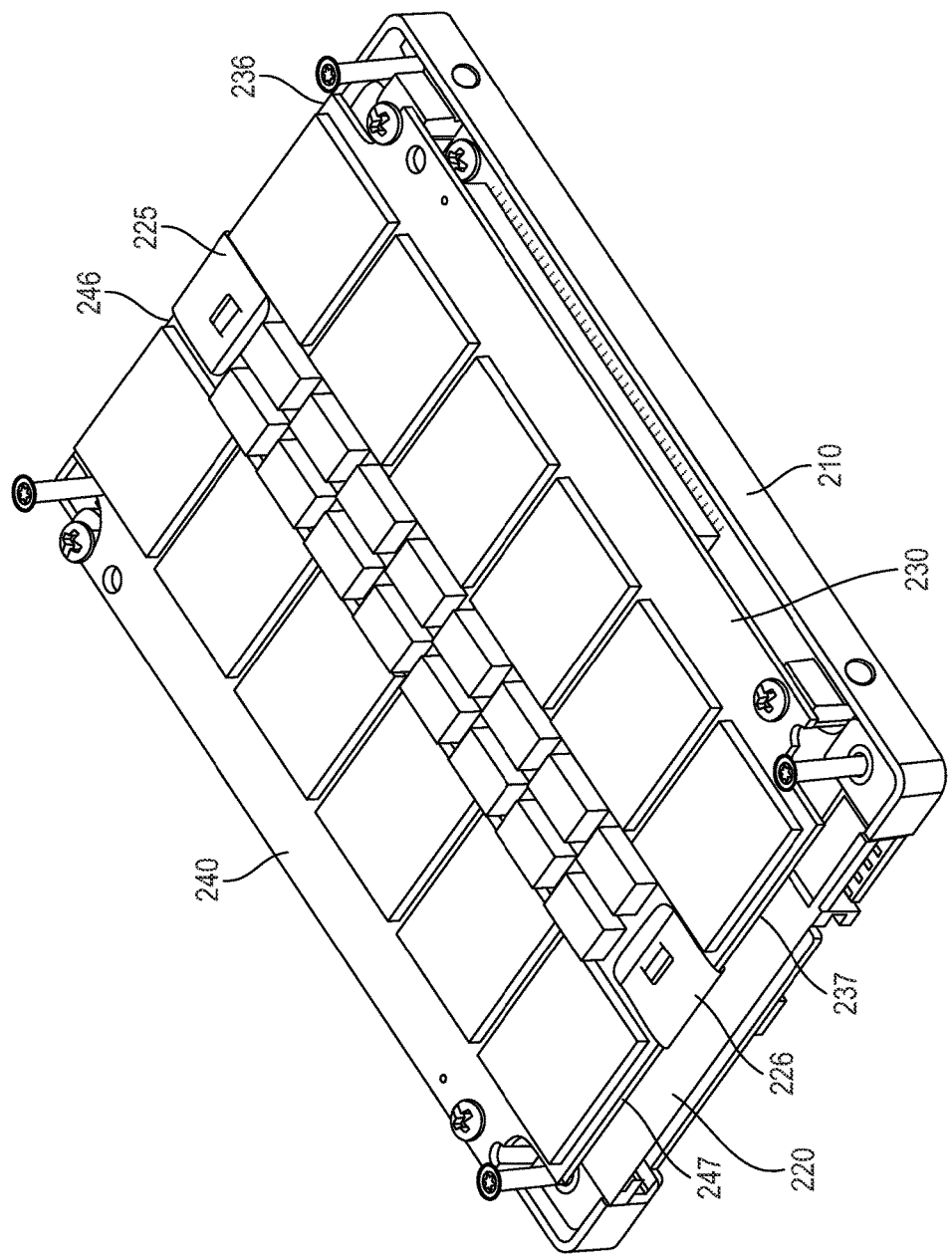
FIG. 2B is an assembled view of a DSD according to another implementation of the present disclosure.

FIG. 2B presents a partially assembled view of a DSD, the cover not shown to showcase the first flash card 240 and the second flash card 230. As seen in FIG. 2B, the main PCB 220, the first flash card 240 and the second flash card 230 generally reside in an interior cavity defined by at least the base 210, and a cover (not shown). A first clip 225 occupies the recess 249 and the recess 239 to connect the first flash card 240 and the second flash card 230 near the first edge 246 and the first edge 236. A second clip 226 similarly connects the first flash card 240 and the second flash card 230 near the second edge 247 and the second edge 237. The first clip 225 and the second clip 226 provide support and stability to the first flash card 240 and the second flash card 230, such that the first flash card 240 and the second flash card 230 are substantially parallel to the main PCB 220.

By separating a conventional flash card into two or more flash cards, the misalignment stress is reduced. Although the present disclosure describes a dual flash card configuration, more flash cards may be used as needed. The dual flash card approach de-couples the connectors, which reduces stress on the cards as well as the pins. Because misalignment is reduced, the amount of force required to mate each flash card to the main PCB is reduced. In addition, having more than one flash card may simplify designs and fabrication as the lengths of traces may be reduced.

The two flash cards may be twin flash cards in certain implementations, allowing for interchangeable flash cards, which alleviates manufacturing and inventory issues. The implementations below describe various example arrangements for mounting and connecting the flash cards.

Figure 3A:
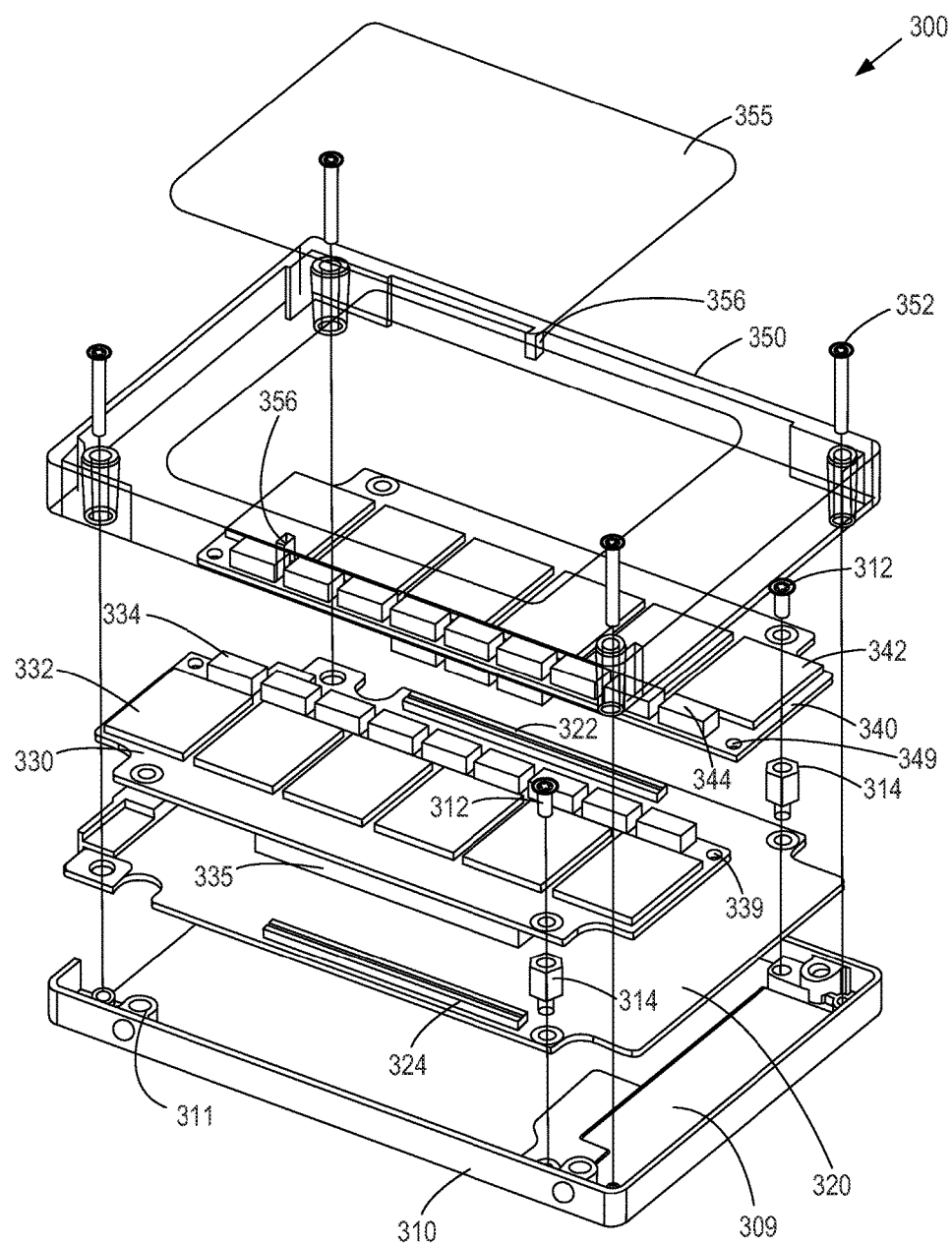
FIG. 3A is an exploded view of a DSD according to an implementation of the present disclosure.

FIG. 3A presents one implementation of a flash card in a DSD 300, utilizing two standoffs and two hard stops. The DSD 300 includes a base 310, a main PCB 320, a first flash card 330, a second flash card 340, a cover 350, and a label 355.

The base 310 has a feature 311 and a cavity 309, which may provide space for additional components such as a capacitor bank. The main PCB 320 includes a first PCB connector 324 and a second PCB connector 322. The first flash card 330 includes a plurality of flash memory 332 as well as a plurality of capacitors 334. A connector 335 connects the flash card 330 to the main PCB 320. The flash card 330 also includes recesses 339. The second flash card 340 includes a plurality of flash memory 342 as well as a plurality of capacitors 344, and recesses 349. Although not visible in FIG. 3A, the flash card 340 also includes a connector to mate with the PCB connector 322. The cover 350 includes hard stops 356. A series of screws 352 attach the cover 350 to the base 310, as shown in FIG. 3A.

The main PCB 320 is secured to the base 310 by two standoffs 314 as well as two screws 352. The first flash card 330 is secured to the base 310 via a screw 312 mating with a standoff 314. Using only one screw per flash card allows for more space on the main PCB 320, rather than using space for more screws/standoffs. However, in this design, a portion of the flash card 330 opposite from the standoff 314 is not secured or is otherwise free-floating. This may allow that portion of the flash card 330 to vibrate, hitting other components or loosening connections. To secure this end of the flash card 330, the cover 350 has a hard stop 356 which braces the flash card 330, preventing excessive vibration or movement. Similarly, the second flash card 340 is secured by a standoff 314 and a hard stop 356. As further seen in FIG. 3A, the corners of the flash card 330 and the flash card 340 have cutouts to better fit with the main PCB 320 and the base 310. In addition, although the DSD 300 generally uses two standoffs 314 and two hard stops 356, in other implementations more or less standoffs 314 and/or hard stops 356 may be used, located as needed on the base 310 and/or the cover 350. For example, more hard stops 356 may be desirable to better brace the flash card 330 and the flash card 340. However, depending on space requirements, there may not be room for additional hard stops 356.

Figure 3B:
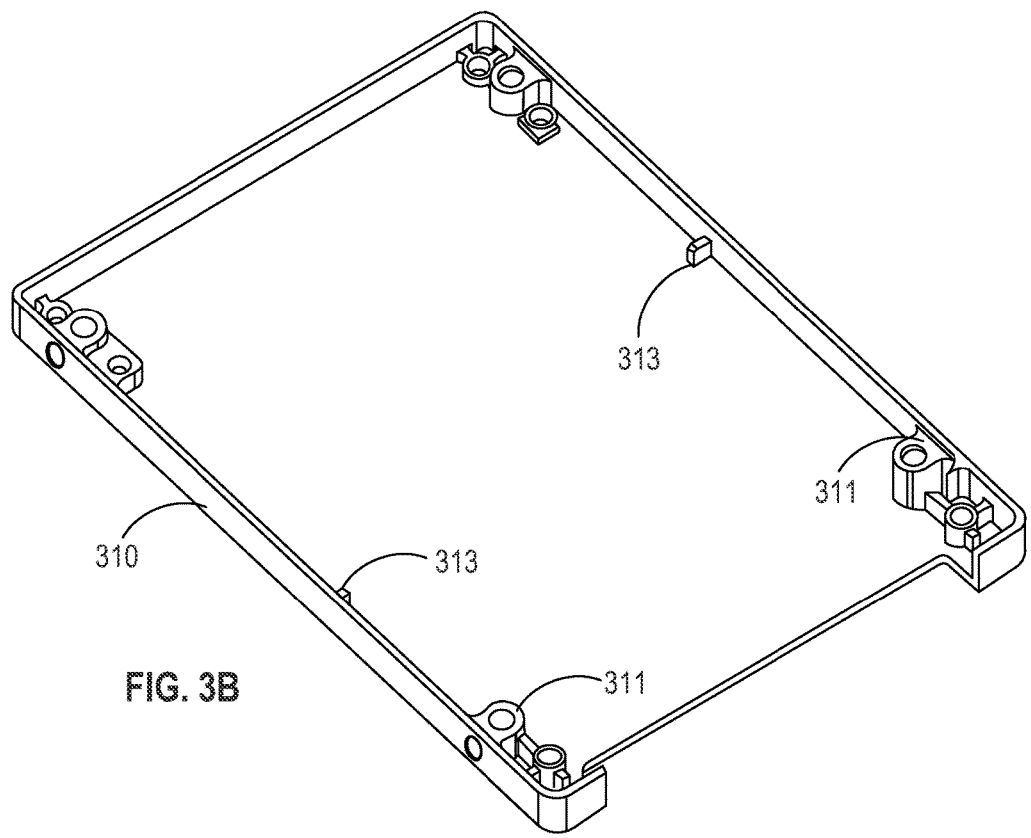
FIG. 3B is a view of the base in FIG. 3A.
Figure 3C:
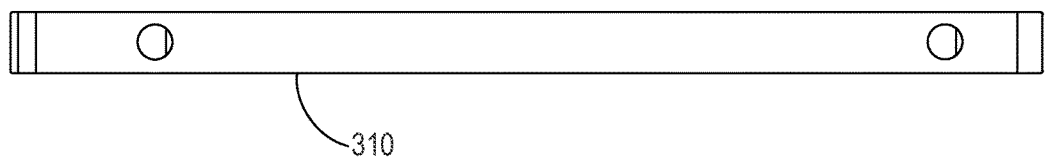
FIG. 3C is a side view of the base in FIG. 3A.

FIGS. 3B and 3C show the base 310. The base 310 may be a base casting interchangeably used for various other DSDs. As such, the base 310 has features 311, which may provide a mounting connection for components, or as seen in FIG. 3A, remain unused. The base 310 may further have one or more hard stops 313, which can provide support for the main PCB 320 or other components. As seen in FIG. 3C, the base 310 does not have any protrusions extending beyond the height of the sidewall. This may be suitable for various device profiles, such as 7 mm.

Figure 4A:
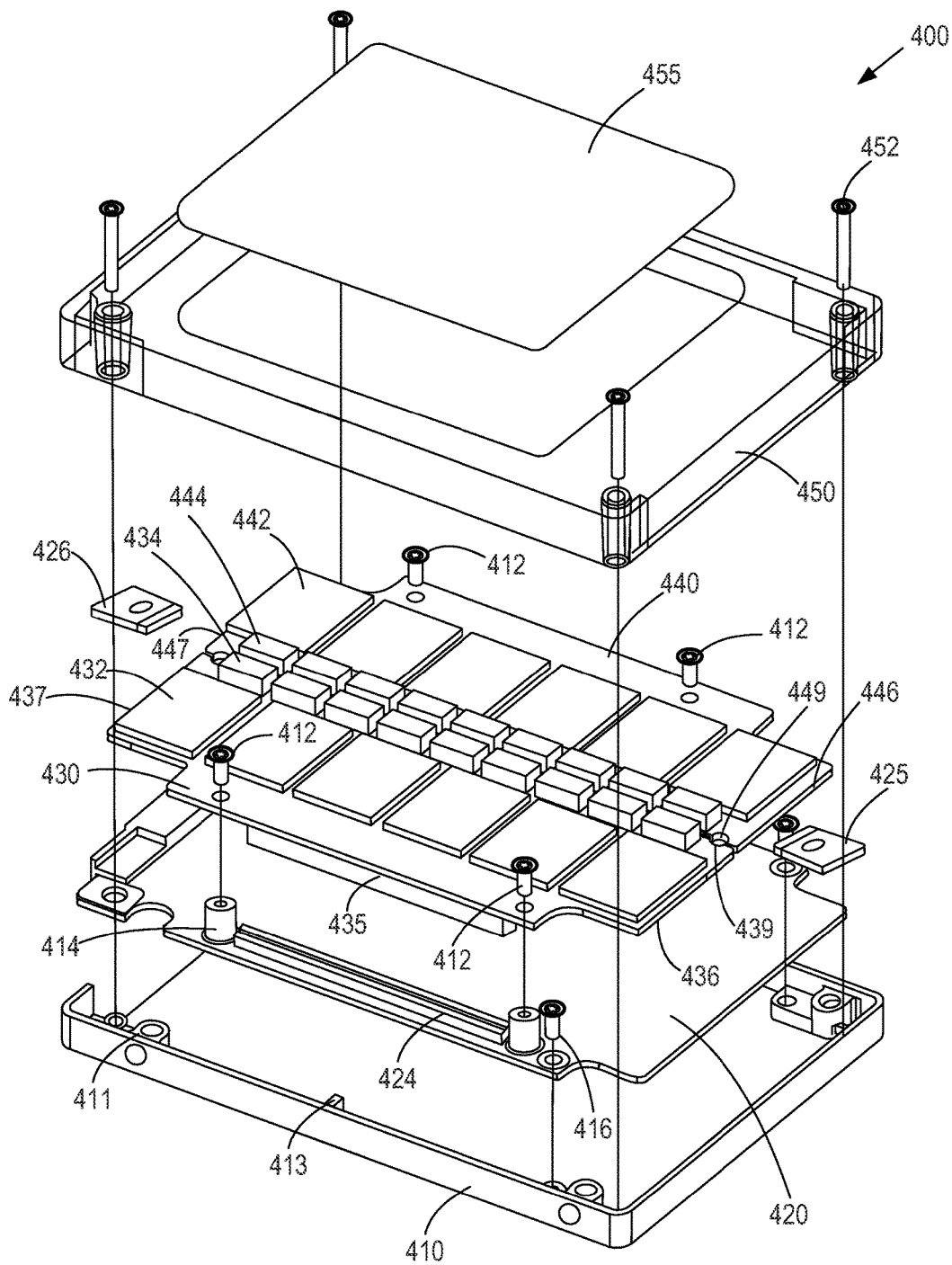
FIG. 4A is an exploded view of a DSD according to another implementation of the present disclosure.
Figure 4B:
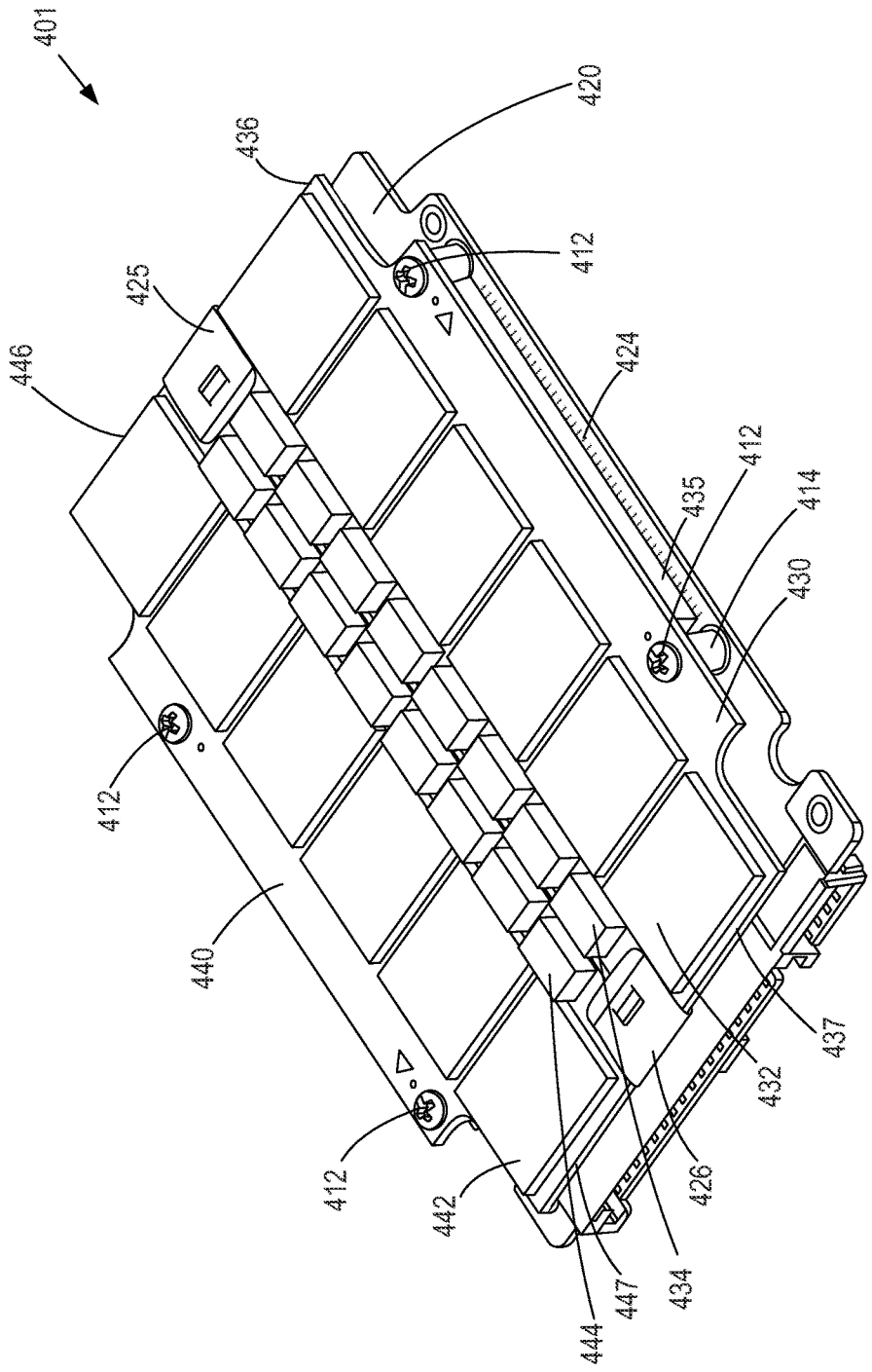
FIG. 4B is a view of a module from the DSD of FIG. 4A.

FIGS. 4A and 4B present another flash card design in a DSD 400, using four standoffs, according to an implementation of the present disclosure. The DSD 400 includes a base 410, a main PCB 420, a first flash card 430, a second flash card 440, and a cover 450. The main PCB 420 includes a PCB connector 424 for mating with a connector 435 of the flash card 430. The main PCB 420 includes another PCB connector (not shown) for mating with the flash card 440. The cover 450 includes a label 455, and is attached to the base 410 by screws 452.

The flash card 430 includes a plurality of flash memory 432 and a plurality of capacitors 434. The flash card 430 includes a first edge 436 and a second edge 437, and a pair of recesses 439 near the first edge 436 and the second edge 437. Similarly, the flash card 440 includes a plurality of flash memory 442 and a plurality of capacitors 444. The flash card 440 includes a pair of recesses 449 near a first edge 446 and a second edge 447.

A pair of standoffs 414 and screws 412 connects the flash card 430 to the main PCB 420. Likewise, a pair of standoffs 414 and screws 412 connects the flash card 440 to the main PCB 420. The standoffs 414 may be screwed into the main PCB 420 or may be otherwise mounted or integrated onto the main PCB 420. The two standoffs 414 for each flash card, which are located on both sides of the PCB connector 424, occupy more space on the main PCB 420, due to the extra mount. However, this configuration provides a more robust assembly, durable against shocks and vibrations.

Unlike the DSD 300, which uses hard stops 356, the DSD 400 does not utilize hard stops to secure the flash card 430 and the flash card 440. Due to manufacturing variances or tolerances, a hard stop may not perfectly align with the final mounted position of a flash card. With vibration, the hard stop may even damage or otherwise loosen the flash card. The DSD 400 uses screws 412 and standoffs 414, but in implementations where the design does not allow for standoffs, hard stops may be used instead.

A first clip 425 attaches to the recess 439 near the first edge 436 of the flash card 430 and the recess 449 near the first edge 446 of the flash card 440 to connect the flash card 430 and the flash card 440. A second clip 426 similarly connects the flash card 430 and the flash card 440 near the second edge 437 of the flash card 430 and the second edge 447 of the flash card 440. The clip 425 and the clip 426 provide stability to the flash card 430 and the flash card 440, similar to a single flash card, without adding undue stress. The main PCB 420 attaches to the base through screws 452 and 416, as seen in FIG. 4A. A pair of hard stops 413 (only one visible in FIG. 4A) provides additional support to the main PCB 420, which may help reduce bending due to the added pressure of the flash card 430 and the flash card 440.

This configuration allows the flash card 430 and the flash card 440 to be mounted to the main PCB 420, forming a module 401 as seen in FIG. 4B. Assembling the module 401 reduces the risk of board deflection during the assembly of the DSD 400. The module 401 may be tested before mounting to the base 410, allowing for easier testing and reducing the likelihood of a teardown for replacement of components before completing the assembly. For example, if there are issues with initializing the flash memory 432 and the flash memory 442, rather than tearing down the DSD by removing the base, the faulty flash memory can be replaced by removing the corresponding flash card. Since the flash card 430 and the flash card 440 are attached by two screws 412 each to the main PCB 420, removal requires removing two screws 412 and the clip 425 and the clip 426. The clip 425 and the clip 426 may optionally be left unconnected until testing is complete. Alternatively, the main PCB 420 may be mounted to the base 410 first, followed by the flash card 430 and the flash card 440.

Figure 4C:
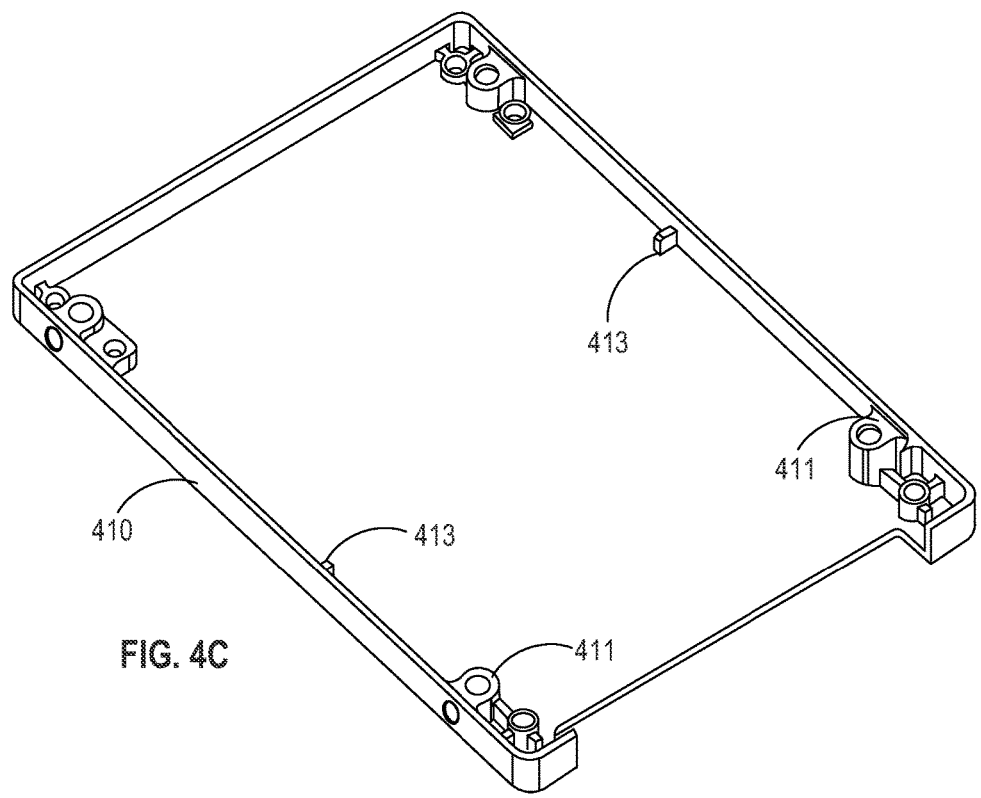
FIG. 4C is a view of the base in FIG. 4A.
Figure 4D:
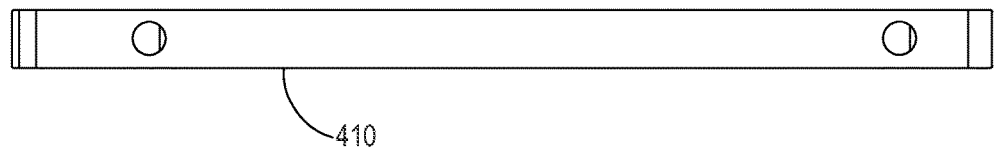
FIG. 4D is a side view of the base in FIG. 4A.

FIGS. 4C and 4D show the base 410. The base 410 may be a base casting interchangeably used for various other DSDs. For example, the base 410 may be the same as the base 310. The base 410 has features 411, which may provide a mounting connection for components, or as seen in FIG. 4A, remain unused. The base 410 has one or more hard stops 413, which can provide support for the main PCB 420 or other components. As seen in FIG. 4D, the base 410 does not have any protrusions extending beyond the height of the sidewall. This may be suitable for various device profiles, such as a 7 mm device profile.

Figure 5A:
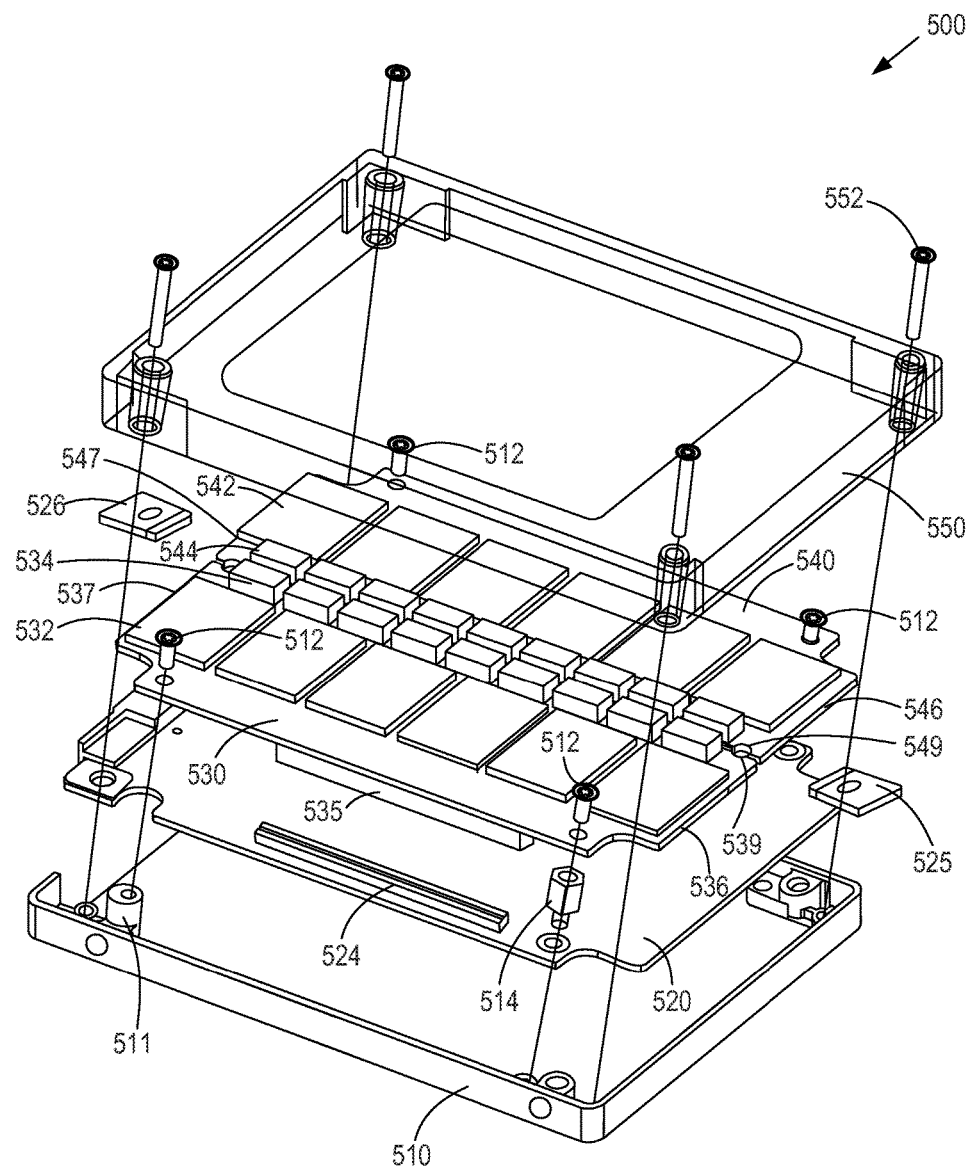
FIG. 5A is an exploded view of a DSD according to another implementation of the present disclosure.
Figure 5B:
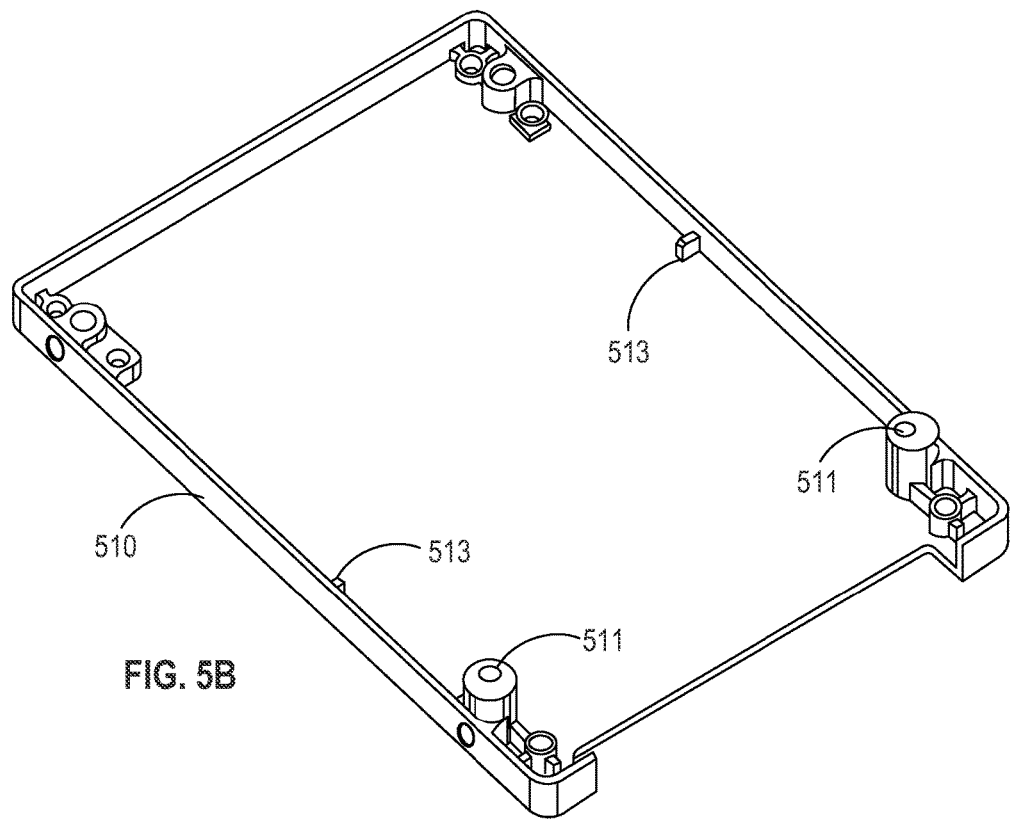
FIG. 5B is a view of the base in FIG. 5A.
Figure 5C:
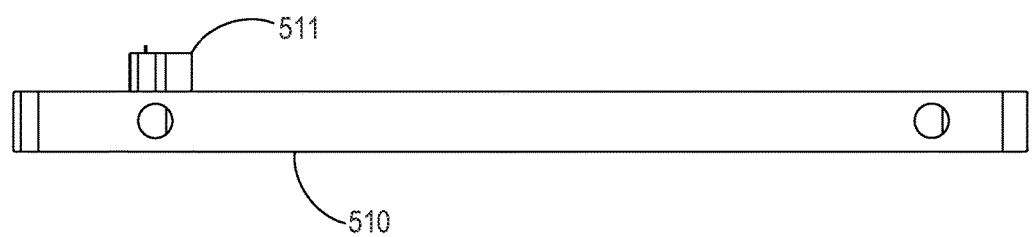
FIG. 5C is a side view of the base in FIG. 5A.

FIGS. 5A-5C depict another implementation of a DSD 500. As seen in FIG. 5A, the DSD 500 includes a base 510, a main PCB 520, a first flash card 530, a second flash card 540, and a cover 550. The cover 550 attaches to the base 510 through screws 552. The main PCB 520 includes a PCB connector 524 for mating with a connector 535 of the flash card 530. The main PCB 520 includes another PCB connector (not shown) for mating with the flash card 540.

The flash card 530 includes a plurality of flash memory 532 and a plurality of capacitors 534. The flash card 530 includes a first edge 536 and a second edge 537, and a pair of recesses 539 near the first edge 536 and the second edge 537. Similarly, the flash card 540 includes a plurality of flash memory 542 and a plurality of capacitors 544. The flash card 540 includes a pair of recesses 549 near a first edge 546 and a second edge 547.

A first clip 525 attaches to the recess 539 near the first edge 536 of the flash card 530 and the recess 549 near the first edge 546 of the flash card 540 to connect the flash card 530 and the flash card 540. A second clip 526 similarly connects the flash card 530 and the flash card 540 near the second edge 537 of the flash card 530 and the second edge 547 of the flash card 540. A screw 512 connects with a standoff 514 over the main PCB 520 to mount the flash card 530 to the base 510. Another screw 512 connects with an integrated standoff 511 of the base 510 to mount the flash card 530 to the base 510. The flash card 540 is similarly mounted.

Using screws 512 to secure the corners of the flash card 530 and the flash card 540 generally provides a robust assembly, protecting against shocks and vibrations. In addition, less space is used on the main PCB, particularly space that may be used for traces, such as near the PCB connector 524.

FIGS. 5B and 5C show views of the base 510. The base 510 includes a pair of protrusions or integrated standoffs 511, which extend above a height of the base 510, as seen in FIG. 5C. In some implementations, the integrated standoffs 511 may be grinded down to not extend beyond the height of the base 510. For example, in a 7 mm profile, the integrated standoffs 511 may be shaved off, whereas in a 15 mm profile, the integrated standoffs 511 may not be shaved off. A pair of hard stops 513 may provide further support to the main PCB 520.

Figure 6A:
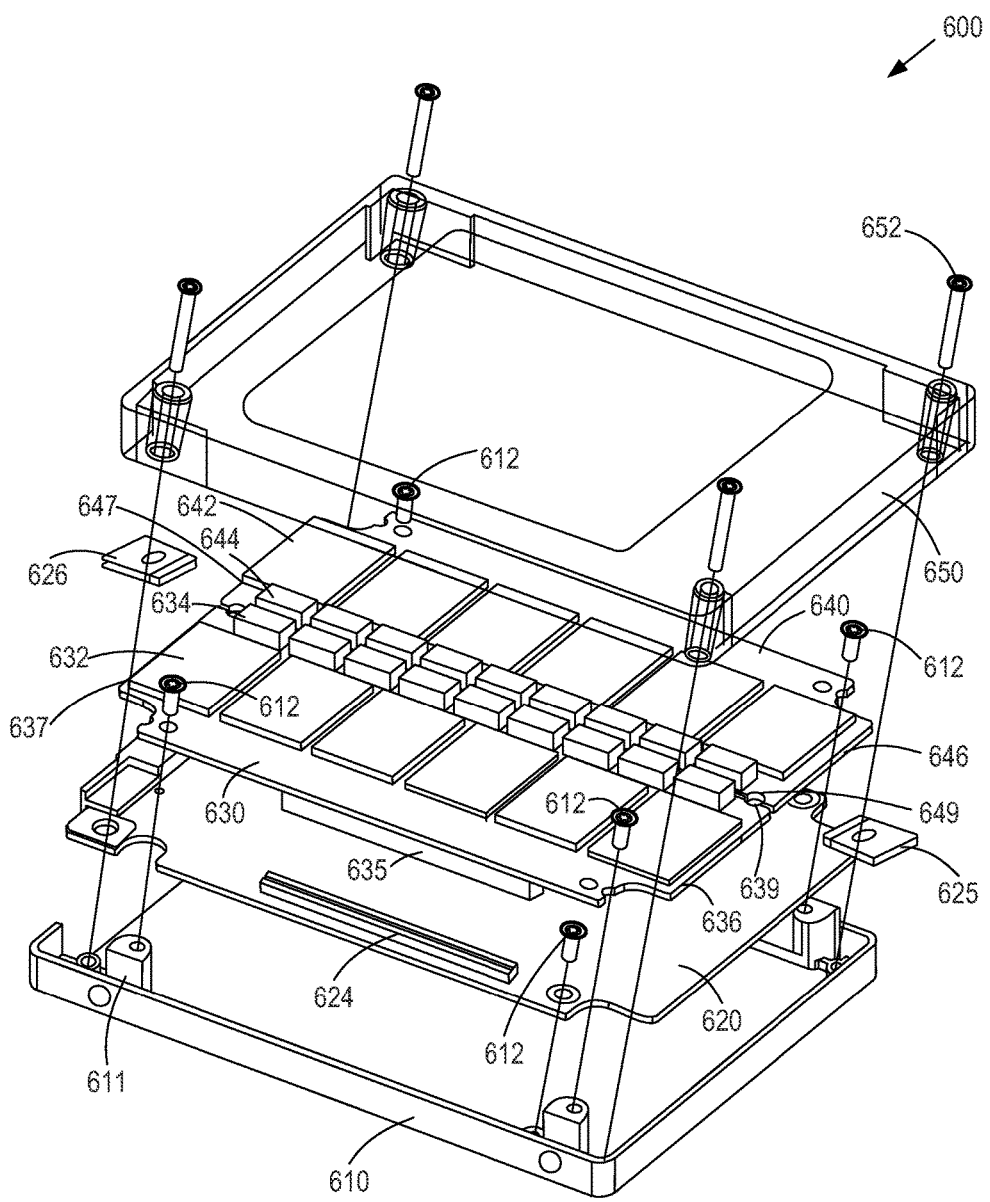
FIG. 6A is an exploded view of a DSD according to an implementation of the present disclosure.

FIGS. 6A-6D depict another implementation of a DSD 600. As seen in FIG. 6A, the DSD 600 includes a base 610, a main PCB 620, a first flash card 630, a second flash card 640, and a cover 650. The cover 650 attaches to the base 610 through screws 652. The main PCB 620 includes a PCB connector 624 for mating with a connector 635 of the flash card 630. The main PCB 620 includes another PCB connector (not shown) for mating with the flash card 640.

Figure 6B:
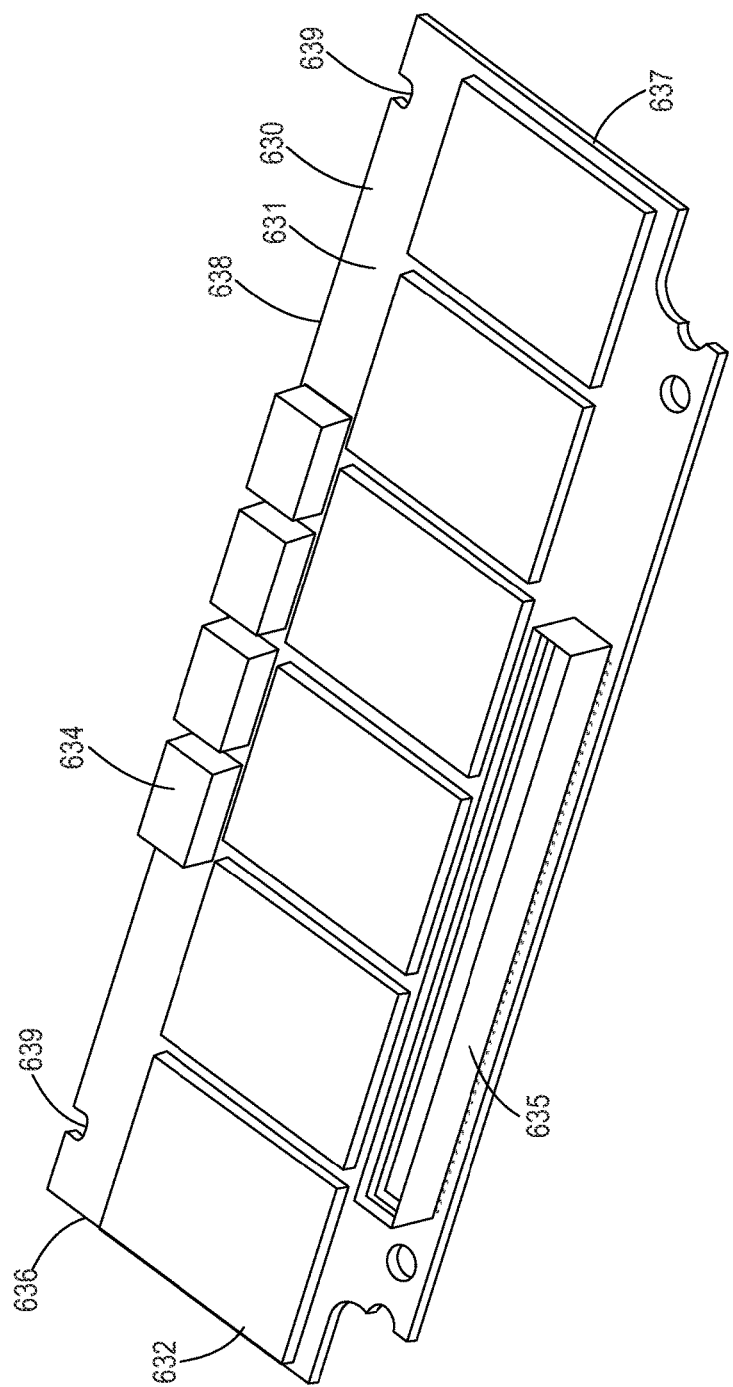
FIG. 6B is a bottom view of a single twin daughter flash card in FIG. 6A.

The flash card 630 includes a plurality of flash memory 632 and a plurality of capacitors 634. The flash card 630 includes a first edge 636 and a second edge 637, and a pair of recesses 639 near the first edge 636 and the second edge 637. Similarly, the flash card 640 includes a plurality of flash memory 642 and a plurality of capacitors 644. The flash card 640 includes a pair of recesses 649 near a first edge 646 and a second edge 647. FIG. 6B illustrates an underside view of the flash card 630. As seen in FIG. 6B, the flash memory 632 and the capacitors 634 may be mounted on a bottom or underside 631 of the flash card 630, near where the connector 635 is disposed. A third edge 638, opposite the connector 635, connects the first edge 636 and the second edge 637.

A first clip 625 attaches to the recess 639 near the first edge 636 of the flash card 630 and the recess 649 near the first edge 646 of the flash card 640 to connect the flash card 630 and the flash card 640. A second clip 626 similarly connects the flash card 630 and the flash card 640 near the second edge 637 of the flash card 630 and the second edge 647 of the flash card 640. A pair of screws 612 connects with a pair of integrated standoffs 611 of the base 610 to mount the flash card 630 to the base 610. The flash card 640 is similarly mounted.

Using screws 612 to secure the corners of the flash card 630 and the flash card 640 provides a robust assembly, protecting against shocks and vibrations. In addition, less space is used on the main PCB, particularly space that may be used for traces, such as near the PCB connector 624. In addition, the use of integrated standoffs 611 rather than standoffs on the main PCB reduces assembly time, as the standoffs do not need to be mounted.

FIG. 6C shows the base 610. The base 610 includes two pairs of protrusions or integrated standoffs 611, which extend above a height of the base 610. In some implementations, the integrated standoffs 611 may be grinded down to not extend beyond the height of the base 610. As seen in FIG. 6C, the integrated standoffs 611 may have a flat portion, which may help in aligning the cover 650 and/or other components during assembly. A pair of hard stops 613 may provide further support to the main PCB 620.

Figure 6D:
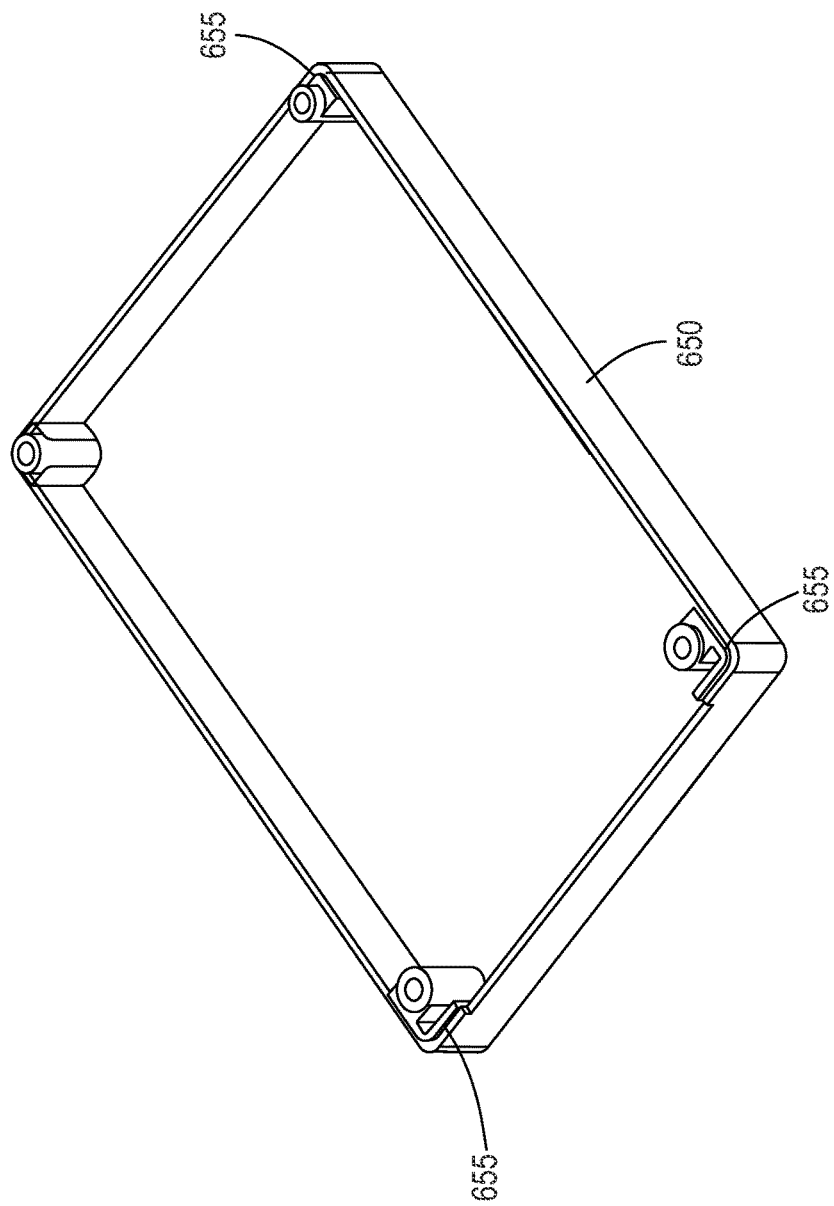
FIG. 6D is a view of the cover in FIG. 6A.

FIG. 6D shows the cover 650. The cover 650 includes two pairs of alignment guides 655. The alignment guides 655 assist in aligning the four corners of the cover 650 to the four corners of the base 610. The alignment guides 655 may further assist in preventing the integrated standoffs 611 from being misaligned.

Figure 7:
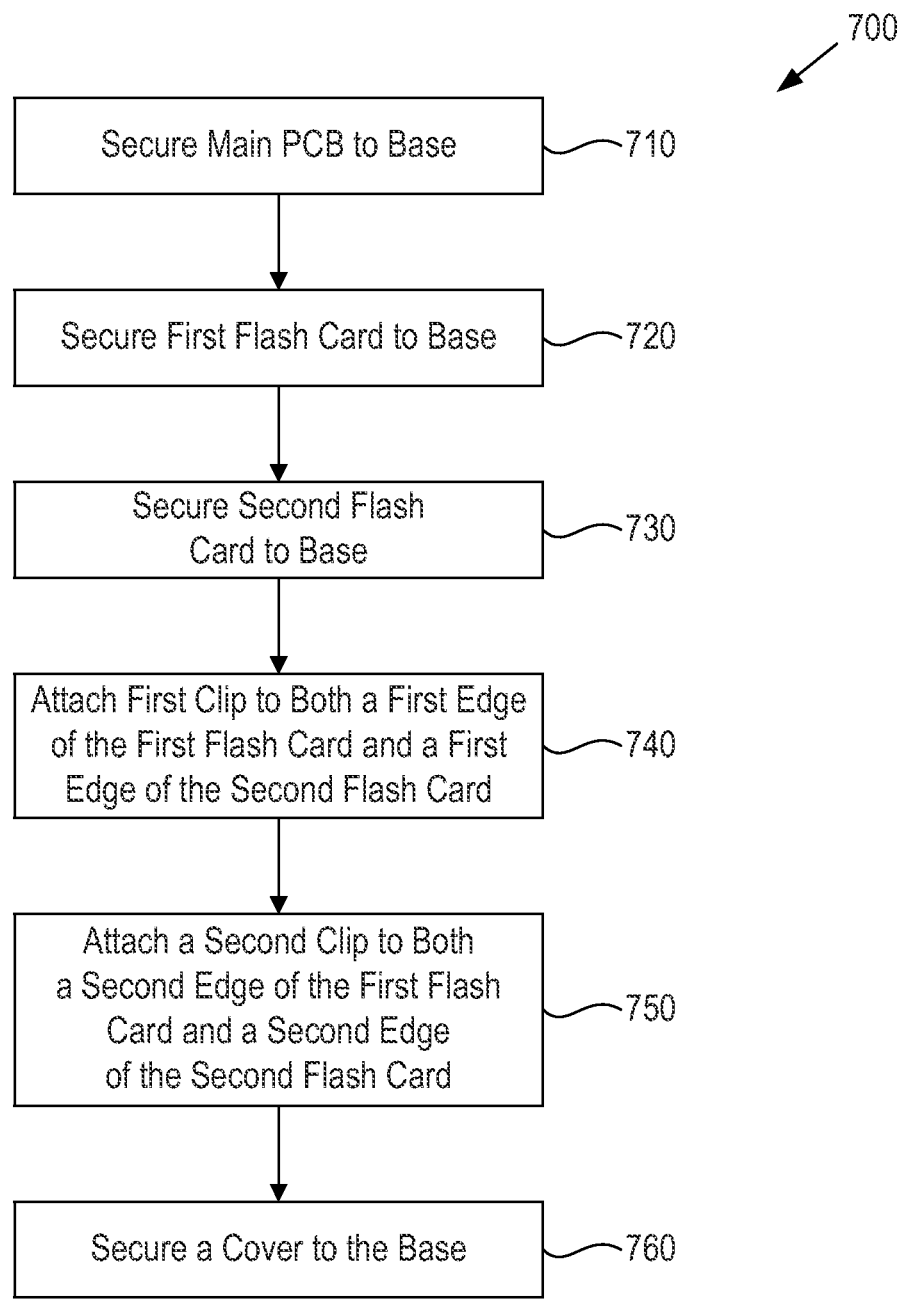
FIG. 7 is a flowchart of assembling a DSD according to an implementation of the present disclosure.

FIG. 7 presents a flowchart 700 of a fabrication method according to an implementation of the present disclosure. The flowchart 700 may correspond to a fabrication process for the DSDs 300, 500, and 600.

At 710, a main PCB, such as the main PCBs 320, 520, or 620, is secured to a base, such as the bases 310, 510, or 610, respectively. As described above, a combination of screws, standoffs, adhesives and/or other mounting mechanisms may be used to mount the main PCB to the base. At 720, a first flash card, such as the flash cards 330, 530, or 630, is secured to the base. The first flash card may be secured by screws, standoffs, adhesives and/or other mounting mechanisms. At 730, a second flash card, such as the flash cards 340, 540, or 640, is secured to the base. The second flash card may be secured by screws, standoffs, adhesives and/or other mounting mechanisms.

At 740, a first clip, such as the clips 325, 525, or 625, is attached to a first edge of the first flash card, such as the edges 336, 536, or 636, respectively, as well a first edge of the second flash card, such as the edges 346, 546, or 646, respectively. At 750, a second clip, such as the clips 326, 526, or 626, is attached to a second edge of the first flash card, such as the edges 337, 537, or 637, respectively, as well as a second edge of the second flash card, such as the edges 347, 547, or 647, respectively.

At 760, a cover, such as the covers 350, 550, or 650, is secured to the base. As described above, the cover may be secured to the base by screws, standoffs, adhesives and/or other mounting mechanisms.

Figure 8:
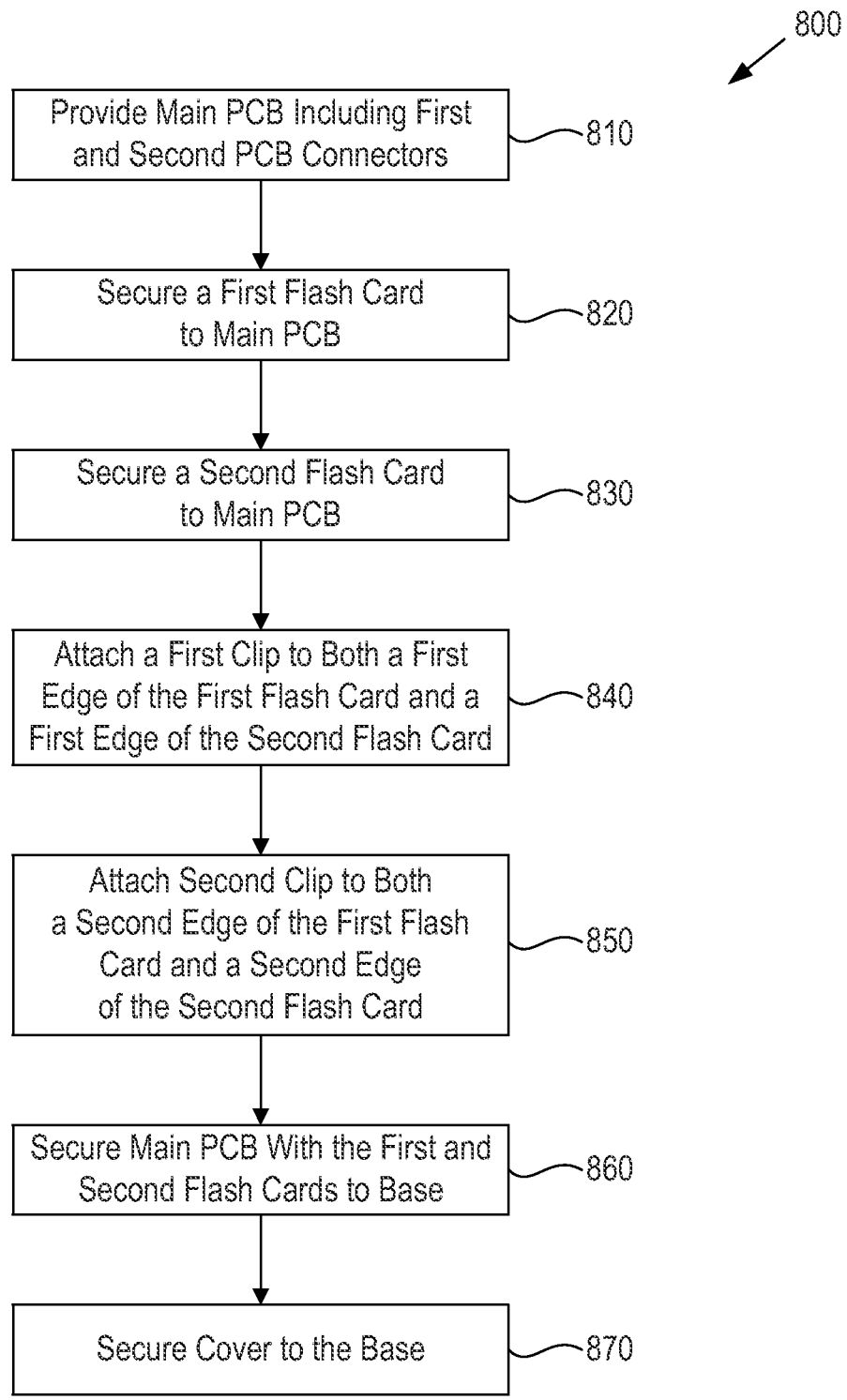
FIG. 8 is a flowchart of assembling a DSD according to another implementation of the present disclosure.

FIG. 8 presents a flowchart 800 of a fabrication method according to an implementation of the present disclosure. The flowchart 800 may correspond to a fabrication process for the DSD 400.

At 810, a main PCB, such as the main PCB 420, is provided. The main PCB has a first and second PCB connector, such as the PCB connector 424. At 820, a first flash card, such as the flash card 430, is secured to the base. The first flash card may be secured by screws, standoffs, adhesives and/or other mounting mechanisms. At 830, a second flash card, such as the flash card 440, is secured to the base. The second flash card may be secured by screws, standoffs, adhesives and/or other mounting mechanisms.

At 840, a first clip, such as the clip 425, is attached to a first edge of the first flash card, such as the edge 436, as well as a first edge of the second flash card, such as the edge 446. At 850, a second clip, such as the clip 426, is attached to a second edge of the first flash card, such as the edge 437, as well as a second edge of the second flash card, such as the edge 447.

After 850, a module, such as the module 401, is formed. The module may be tested, such as testing connections or integrity of components. Because the module is not otherwise mounted to a base, testing may be simplified as ports and connections are more accessible, and components may be more easily replaced.

At 860, a main PCB, such as the main PCB 420, is secured to a base, such as the base 410, respectively. As described above, a combination of screws, standoffs, adhesives and/or other mounting mechanisms may be used to mount the main PCB to the base.

At 870, a cover, such as the cover 450, is secured to the base. As described above, the cover may be secured to the base by screws, standoffs, adhesives and/or other mounting mechanisms.

The foregoing description of the disclosed example implementations is provided to enable any person of ordinary skill in the art to make or use the implementations in the present disclosure. Various modifications to these examples will be readily apparent to those of ordinary skill in the art, and the principles disclosed herein may be applied to other examples without departing from the spirit or scope of the present disclosure. The described implementations are to be considered in all respects only as illustrative and not restrictive and the scope of the disclosure is, therefore, indicated by the following claims rather than by the foregoing description. All changes which come within the meaning and range of equivalency of the claims are to be embraced within their scope.

What is claimed is:

1. A data storage device (DSD) comprising:
   a main printed circuit board (PCB) including a first PCB connector and a second PCB connector;
   a first flash card mounted over the main PCB and including a first flash memory and a first flash card connector configured to connect to the first PCB connector;
   a second flash card mounted over the main PCB and including a second flash memory and a second flash card connector configured to connect to the second PCB connector; and
   a first clip attached to both a first edge portion of the first flash card and to a first edge portion of the second flash card,
   wherein the first flash card and the second flash card are mounted over the main PCB in a plane substantially parallel with the main PCB.

2. The DSD of claim 1, wherein each respective flash card of the first flash card and the second flash card mirror each other about a length of the respective flash card such that each flash card of the first flash card and the second flash card can connect to either the first PCB connector or the second PCB connector.

3. The DSD of claim 1, further comprising a second clip attached to both a second edge portion of the first flash card and to a second edge portion of the second flash card, wherein the first edge portions of the first flash card and the second flash card are opposite the second edge portions of the first flash card and the second flash card.

4. The DSD of claim 1, wherein each respective flash card of the first flash card and the second flash card includes a recess in an edge of the respective flash card configured to secure the first clip.

5. The DSD of claim 1, wherein the first PCB connector is located on a first edge portion of the main PCB and the second PCB connector is located on a second edge portion of the main PCB with the first edge portion of the main PCB opposite the second edge portion of the main PCB.

6. The DSD of claim 1, further comprising a base, wherein each flash card of the first flash card and the second flash card is directly secured to the main PCB and indirectly secured to the base through the main PCB which is directly secured to the base.

7. The DSD of claim 1, further comprising a base, wherein each flash card of the first flash card and the second flash card is directly secured to the base.

8. The DSD of claim 7, wherein the base comprises a first standoff configured to extend beyond the main PCB for connection to the first flash card and a second standoff configured to extend beyond the main PCB for connection to the second flash card.

9. The DSD of claim 1, further comprising a cover including a first hard stop configured to brace the first flash card and a second hard stop configured to brace the second flash card.

10. A method for assembling a data storage device (DSD), the method comprising:
   securing a main printed circuit board (PCB) to a base, wherein the main PCB includes a first PCB connector and a second PCB connector;
   securing a first flash card to the base such that the first flash card is mounted over the main PCB in a plane substantially parallel to the main PCB and a flash card connector of the first flash card is connected to the first PCB connector;
   securing a second flash card to the base such that the second flash card is mounted over the main PCB in the plane substantially parallel to the main PCB and a flash card connector of the second flash card is connected to the second PCB connector; and
   attaching a first clip to both a first edge portion of the first flash card and to a first edge portion of the second flash card.

11. The method of claim 10, wherein the first clip is attached to the first edge portions of the first flash card and the second flash card by securing the first clip into a recess in an edge of each flash card of the first flash card and the second flash card.

12. The method of claim 10, further comprising attaching a second clip to both a second edge portion of the first flash card and to a second edge portion of the second flash card, wherein the first edge portions of the first flash card and the second flash card are opposite the second edge portions of the first flash card and the second flash card.

13. The method of claim 10, further comprising securing a cover to the base so as to define an interior cavity of the DSD, the base including a first protrusion protruding toward the first flash card and a second protrusion protruding toward the second flash card.

14. A method for assembling a data storage device (DSD), the method comprising:
   securing a first flash card to a main printed circuit board (PCB) including a first PCB connector and a second PCB connector such that the first flash card is mounted over the main PCB in a plane substantially parallel to the main PCB and a flash card connector of the first flash card is connected to the first PCB connector;
   securing a second flash card to the main PCB such that the second flash card is mounted over the main PCB in the plane substantially parallel to the main PCB and a flash card connector of the second flash card is connected to the second PCB connector;
   securing the main PCB with the first flash card and the second flash card to a base; and
   securing a cover to the base so as to define an interior cavity of the DSD, the base including a first protrusion protruding toward the first flash card and a second protrusion protruding toward the second flash card.

15. The method of claim 14, further comprising attaching a first clip to both a first edge portion of the first flash card and to a first edge portion of the second flash card.

16. The method of claim 15, wherein the first clip is attached to the first edge portions of the first flash card and the second flash card by securing the first clip into a recess in an edge of each flash card of the first flash card and the second flash card.

17. The method of claim 15, further comprising attaching a second clip to both a second edge portion of the first flash card and to a second edge portion of the second flash card, wherein the first edge portions of the first flash card and the second flash card are opposite the second edge portions of the first flash card and the second flash card.

18. A data storage device (DSD) comprising:
   a main printed circuit board (PCB) including a first PCB connector and a second PCB connector;
   a first flash card mounted over the main PCB and including a first flash memory and a first flash card connector configured to connect to the first PCB connector;
   a second flash card mounted over the main PCB and including a second flash memory and a second flash card connector configured to connect to the second PCB connector;
   a base secured to the main PCB and to each flash card of the first flash card and second flash card; and
   a cover secured to the base so as to define an interior cavity of the DSD, the base including a first protrusion protruding toward the first flash card and a second protrusion protruding toward the second flash card,
   wherein the first flash card and the second flash card are mounted over the main PCB in a plane substantially parallel with the main PCB.

19. The DSD of claim 18, wherein each flash card of the first flash card and the second flash card mirror each other about a length of a respective first flash card or the second flash card such that each flash card of the first flash card and the second flash card can connect to either the first PCB connector or the second PCB connector.

20. The DSD of claim 18, further comprising a first clip attached to both a first edge portion of the first flash card and to a first edge portion of the second flash card.

* * * * *